United States Patent [19]

Schroeder

[11] 4,449,690

[45] May 22, 1984

[54] APPARATUS FOR ENCAPSULATION CASTING

[75] Inventor: Jon M. Schroeder, 10835 Morgan Territory Rd., Livermore, Calif. 94550

[73] Assignee: Jon M. Schroeder, Livermore, Calif.

[21] Appl. No.: 402,714

[22] Filed: Jul. 28, 1982

Related U.S. Application Data

[62] Division of Ser. No. 224,658, Jan. 13, 1981, Pat. No. 4,374,080.

[51] Int. Cl.³ .............................................. B28B 9/00
[52] U.S. Cl. ...................................... 249/85; 249/83; 249/95; 249/110
[58] Field of Search ...................... 249/83, 84, 85, 95, 249/110

[56] References Cited

U.S. PATENT DOCUMENTS

| 3,058,156 | 10/1962 | O'Connor | 249/95 |
|---|---|---|---|
| 3,471,900 | 10/1969 | Burns | 264/272.11 |
| 3,530,541 | 9/1970 | Burns | 249/95 |
| 3,542,328 | 11/1970 | Dietrick | 249/95 |
| 3,659,821 | 5/1972 | Sakamoto et al. | 264/272.17 |
| 3,944,182 | 3/1976 | Yamagita et al. | 249/83 |
| 4,003,544 | 1/1977 | Bliven et al. | 249/95 |
| 4,155,532 | 5/1979 | Lambrecht et al. | 249/95 |
| 4,155,533 | 5/1979 | Lambrecht | 249/95 |
| 4,332,537 | 6/1982 | Slepcevic | 249/83 |

*Primary Examiner*—Donald E. Czaja
*Assistant Examiner*—W. Thompson
*Attorney, Agent, or Firm*—Donald E. Schreiber

[57] ABSTRACT

An apparatus and a method of use thereof for cast encapsulation of items, particularly electronic components. The apparatus consists of a plurality of identically shaped split matrix elements. Each matrix element has a first surface for receiving and securing the item to be encapsulated. A second surface of another identically shaped matrix element, located on a side thereof opposite to its first surface, is then mated with the first surface securing the item. Thus mated, the first and second surfaces establish a molding cavity for enclosing the item and an orifice providing access thereto. This process of securing an item to a first surface and enclosing it with a second surface is repeated thereby assembling a stack of matrix elements. This stack is then rigidly secured and the molding cavities are filled with particulate filler material through upright orifices. Excess filler is removed by quickly turning the stack over and then righting it again. The stack of matrices is then heated, its orifices filled with a quantity of heated, liquid thermosetting encapsulating compound and exposed to vacuum whereby substantially all air is drawn from the molding cavities through the liquid encapsulating compound. The stack is then again exposed to atmospheric pressure forcing the encapsulating compound throughout the unoccupied voids in the molding cavities after which that compound is permitted to solidify, thereby completing the encapsulation process.

6 Claims, 6 Drawing Figures

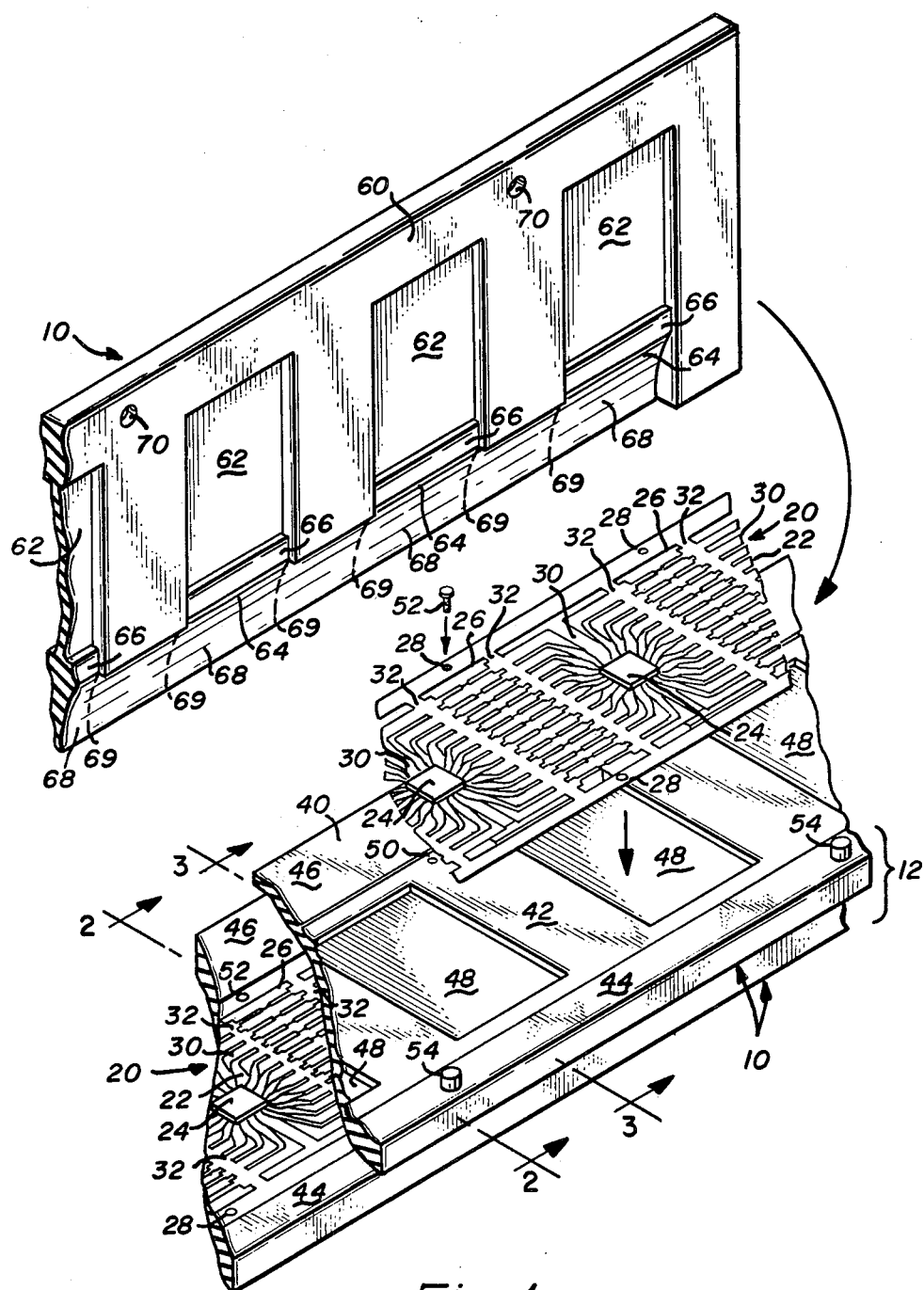
Fig_1

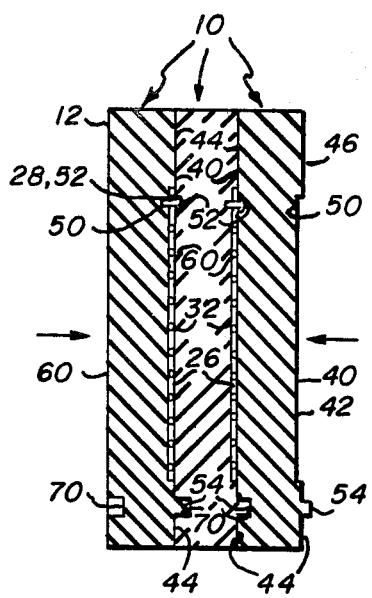
Fig_2
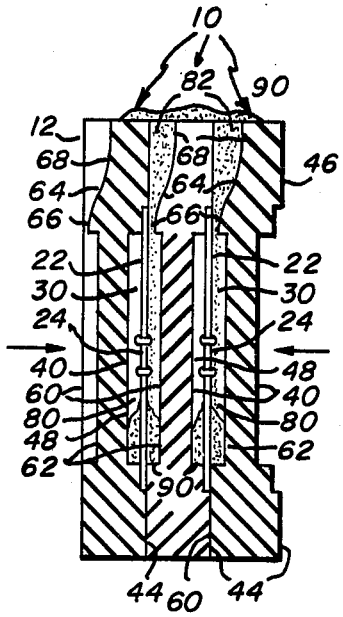
Fig_3
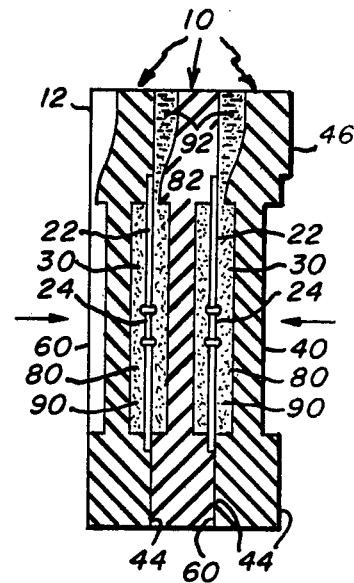
Fig_4
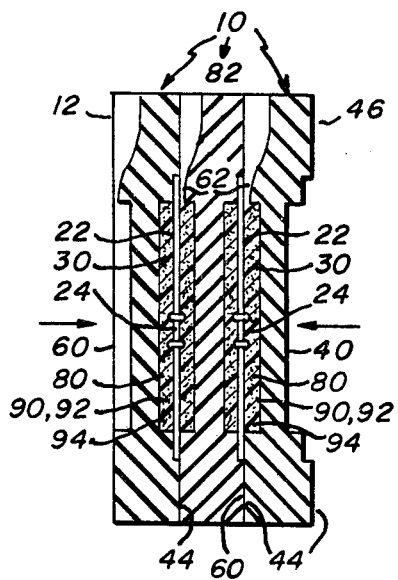
Fig_5
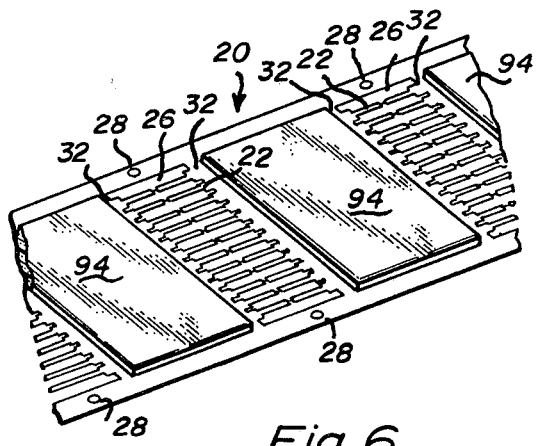
Fig_6

APPARATUS FOR ENCAPSULATION CASTING

This is a division, of application Ser. No. 06/224,658, filed Jan. 13, 1981 now U.S. Pat. No. 4,374,080.

BACKGROUND OF THE INVENTION

1. Field of the Invention

The present invention relates generally to casting and more particularly to encapsulation of items within thermosetting polymeric materials.

2. Description of the Prior Art

Cast encapsulation of items, particularly electronic components, is a well established packaging technology. Currently, such items are encapsulated by a process called transfer molding. In this process, a thermosetting encapsulation material is retained within a chamber in a transfer molding machine while an item to be encapsulated is secured within a molding cavity in another portion of the machine. The chamber containing the thermosetting encapsulant and the molding cavity are connected by one or more passages so that pressure applied to the thermosetting encapsulant may cause it to flow into the molding cavity and around the item to be encapsulated. After the thermosetting encapsulant has solidified, the item, now encapsulated, may be removed from the molding cavity.

The encapsulation material often used in the transfer molding process is an epoxy resin mixed with a particulate filler such as silica or alumina. These particulate materials are incorporated into the encapsulation material principally to increase its thermal conductivity. The greater the concentration of particulate filler in the encapsulation material, the higher its thermal conductivity. However, addition of this particulate material to the thermosetting resin also increases its viscosity, thereby creating a corresponding increase in the force required for transfer molding.

There are several problems with the transfer molding process as currently employed to encapsulate items such as electronic components. First, because high pressures are required to transfer the thermosetting encapsulant into the molding cavity, that cavity must be fabricated from metal. Since the thermosetting encapsulant materials such as epoxy resins normally bond well to metal, the general practice in the industry is to incorporate a mold release compound into the encapsulant material so that after it has solidified the encapsulated item may be easily removed from the molding cavity. However, since the electrically conductive leads by which electrical currents flow into or out of an electronic component are generally made of metal, these mold release compounds may also permit the encapsulation to separate from the electrically conductive leads. Since contact with air, particularly the moisture in air, often degrades the performance of electronic components, the detachment of the encapsulation from the electrically conductive leads provides a path by which moisture may reach an encapsulated component and thus may contribute to its failure.

A second problem with transfer molding as currently practiced in encapsulating electronic components is referred to as "wire sweep." The term "wire sweep" describes the bending of electrically conductive leads by the force of inflowing encapsulation material. Since the electrically conductive leads of electronic components being encapsulated are generally quite fragile and must remain electrically insulated from each other after encapsulation, "wire sweep" establishes an upper limit on the rate at which encapsulation material may be transferred into the molding cavity. Furthermore, this rate of transfer decreases as the viscosity of the encapsulation material increases such as occurs with increasing concentrations of particulate filler. Therefore, the current transfer molding process involves a trade-off between the thermal conductivity of the encapsulation material and the speed with which the molding cavity may be filled without damaging the item being encapsulated.

SUMMARY OF THE PRESENT INVENTION

An object of the present invention is to provide an encapsulation process employing simple and economical apparatus therefor.

Another object of the present invention is to provide an encapsulation for electronic components having high thermal conductivity.

Another object of the present invention is to provide an encapsulation for electronic components in which the volume of the encapsulation is fully occupied by particulate filler.

Another object of the present invention is to provide an encapsulation which excludes moisture therefrom.

A further object of the present invention is to provide an encapsulation process which does not require the inclusion of mold release compounds into the encapsulation material.

Briefly, the apparatus employed in the preferred embodiment of the present invention includes a plurality of identically shaped split matrix elements. Each matrix element has a first surface shaped to form a portion of a molding cavity surface and to receive and retain the item to be encapsulated. A second surface of each matrix element is shaped to mate with the first surface thereof of another element and, when so mated, to establish the remainder of a molding cavity surface enclosing the item to be encapsulated. The first and second surfaces of each matrix element are located on opposite sides thereof relative to one another so that, in principal, an unlimited number of elements may be successively mated to assemble a stack for enclosing items to be encapsulated. The surfaces of the matrix elements are also shaped so as to establish an orifice leading from the exterior to the molding cavity by which encapsulation material may be introduced thereinto.

In the preferred embodiment of this invention, these identically shaped matrix elements are cast from silicone rubber. Since thermosettng encapsulation materials, particularly epoxies, do not adhere to silicone rubber, mold release agents need not be included in the encapsulation material cast with these matrix elements.

A stack of the matrix elements is established by successively securing an item to be encapsulated to a first surface of a first matrix element and then enclosing the item within a molding cavity established by mating the second surface of a second matrix element thereto. The stack may be increased by including third, fourth, fifth, etc., elements in a stacking relationship. The stack thus assembled is rigidly secured and positioned so that the exterior opening to the orifices leading to the molding cavities face upward. The particulate filler to be incorporated into the encapsulation may then be introduced into these orifices so that it may fill the molding cavities much in the same way that sand flows from the top to the bottom of an hour glass. The manner in which the particulate filler material enters the molding cavity is a gentle one and each cavity becomes filled with the maximum possible amount of particulate filler. Furthermore, the particulate material thus filling the molding cavities mechanically supports the electrically conductive leads, thus preventing their damage by subsequent introduction of other material thereinto. In the preferred embodiment, the orifices for filling the molding cavities are shaped so as to have a narrow gate region immediately adjacent to the cavity and a much broader sprue region further therefrom. This shape permits removal of any excess particulate filler from these orifices by a quick, 360 degree rotation of the rigidly secured matrix element stack. During such a rotation, particulate material easily flows from the orifice while it is retained within the molding cavity by the narrow gate region thereof.

The rigidly secured stack of matrix elements establishing molding cavities now containing an item to be encapsulated surrounded by particulate filler material is then heated and its upright orifices are filled with a quantity of heated, liquid thermosetting encapsulating compound. This assembly is then exposed to vacuum which draws substantially all air including all moisture from the molding cavities. These gasses leave the molding cavities by bubbling up through the liquid encapsulating compound in the orifices leading thereto. After all gasses have been removed from the volume of the molding cavity unoccupied by the particulate filler, the assembly is again exposed to atmospheric pressure which forces the encapsulating compound throughout the molding cavity. The liquid encapsulating compound is then permitted to solidify, after which the stack of matrix elements is disassembled and the encapsulated items are removed from the molds. Since the liquid encapsulation material employed in the preferred embodiment of this invention does not include a mold release agent, the encapsulation thus formed integrally bonds to the electrically conductive leads connected to an encapsulated electronic component, thereby establishing a barrier to future entry of moisture into the encapsulation.

An advantage of the process of the present invention is that it employs a simple and economical molding apparatus.

Another advantage is that an encapsulation fabricated in accordance with this invention has excellent thermal conductivity.

Yet another advantage is that an encapsulation has the highest possible volume thereof occupied by particulate filler material.

Still another advantage of the present invention is that moisture is removed from the encapsulated item during the process.

A further advantage of the present invention is that the thermosetting resin need not include a mold release compound.

These and other objects and advantages of the present invention will no doubt become apparent to those skilled in the art after having read the following detailed description of the preferred embodiment which is illustrated in the several figures of the drawings.

IN THE DRAWINGS

FIG. 1 is a partially sectioned perspective view of a stack assembly of matrix elements enclosing items to be encapsulated in accordance with the present invention;

FIG. 1A is a bottom view of a section of another element which may be placed on top of the top element of FIG. 1 to further increase the stack;

FIG. 2 is a cross-sectional view of the stack of matrix elements taken along the line 2—2 of FIG. 1, with the element of FIG. 1A stacked thereon;

FIG. 3 is a cross-sectional view of the stack of matrix elements taken along the line 3—3 of FIG. 1 with the element of FIG. 1A stacked thereon showing particulate filler material being introduced into the molding cavities;

FIG. 4 is a cross-sectional view of the stack of matrix elements of FIG. 3 showing evacuation of the molding cavities;

FIG. 5 is a cross-sectional view of the stack of matrix elements of FIG. 4 showing solidified thermosetting resin; and FIG. 6 is a perspective view of an encapsulated item after encapsulation and removal from the molding cavities of the assembly of FIG. 1.

DETAILED DESCRIPTION OF THE PREFERRED EMBODIMENT

FIG. 1 illustrates a plurality of split matrix elements, each referred to by the general reference number 10, being assembled on top of one another to form an overall stack 12. The stack 12 is adapted to receive and enclose a plurality of electronic component assemblies referred to by the general reference number 20, to be encapsulated. The illustrated electronic component assemblies 20 are in the form of Dual Incline Package lead frames 22, (DIP lead frame) each of which includes a plurality of electronic component chips 24. Each DIP lead frame 22 includes a plurality of pin region openings 26, periodically spaced along its length. A reference aperture 28 is formed into both longitudinal edges of the frame adjacent each pin region 26. The DIP lead frame 22 further includes plurality of chip bonding region opening 30 also spaced periodically along its length between the pin region opening 26 and respectively separated therefrom by dam bars 32.

Each split matrix element 10 forms a first longitudinal surface 40 with a depressed frame region 42 (see FIG. 1), adapted to receive the lead frame 22 formed about the center. Along one longitudinal outer edge of the frame region 42 is a raised lower seal region 44, while along the other longitudinal outer edge is a raised orifice forming region 46. Formed into the frame region 42 at periodic intervals along its length are a plurality of halves of a molding cavity surface 48 in the form of a rectangular depression. The mold cavity surfaces 48 are laterally spaced along the length of the frame region 42 and are shaped to mate with the chip bonding regions 30 of the lead frame 22. Also formed into the frame region 42 intermediate adjacent molding cavity surfaces 48 and adjacent to the orifice region 46 are pin apertures 50 located so as to mate with the reference apertures 28 of the lead frames 22 to be encapsulated. After the lead frame 22 has been positioned within the frame region 42, a pin 52 is inserted through the reference aperture 28 and into the aperture 50 to assure alignment of the dam bars 32 with the edges of the molding cavity surface 48 (see FIGS. 1 and 2). Also formed integrally into the split matrix element 10 and projecting from the lower sealing region 44 are reference pins 54.

Each of the identically shaped matrix elements 10 is formed with a second surface 60, shown in FIG. 1A, located opposite to the first surface 40. The second surface 60 is essentially planar, having formed thereinto a plurality of periodically spaced molding cavities 62. The molding cavities 62 are also spaced along the length of the second surface 60 and are also shaped so as to mate with the chip bonding opening regions 30 of the lead frame 22. Along one edge of the surface 60 at the end of each of the molding cavity surfaces 62 is an orifice region 64 extending to the exterior of the element 10. Each orifice region 64 has a gate segment 66 immediately adjacent to the molding cavity 62 and a sprue segment 68 (lying between adjacent pairs of dashed lines 69) farthest therefrom and extending to the exterior. In the embodiment 10, the sprue segments 68 of each orifice region 64 are interconnected to facilitate simultaneous filling of the molding cavities 62. Also formed into the second surface 60 along the longitudinal edge farthest from the orifice region 64 are reference apertures 70. The reference apertures 70 mate with the reference pins 54 to align the molding cavitys 62 in the second surface 60 with the molding cavitys 48 of the first surface 40. In the preferred embodiment, the split matrix elements 10 are cast from a silicone rubber material having a hardness of approximately sixty durometers when solidified.

As shown in FIG. 1 and FIG. 1A, the stack assembly 12 of matrix elements 10 is assembled by locating an electronic component assembly 20 within the frame region 42 of a split matrix element 10 and securing it thereto by inserting a pin 52 through the reference aperture 28 in the lead frame 22 and into the pin aperture 50 (See FIG. 2). With the electronic component assembly 20 thus secured about the first surface 40 of a split matrix element 10, the next layer in the stack 12 is assembled by mating the second surface 60 of another of the matrix elements 10 to the first surface 40. Thus, in principle, a stack assembly 12 may include an unlimited number of split matrix elements 10. Thus, an unlimited number of components 20 may be simultaneously accommodated with each electronic component assembly 20 located intermediate mated first surfaces 40 and second surfaces 60. Also, the elements 10 may be of unlimited length to accommodate a plurality of lead frames 22 in tandem.

The stack 12 of split matrix elements 10 enclosing electronic component assemblies 20 thus assembled may then be rigidly secured by applying a clamping force to the exposed outer first surface 40 and exposed second surface 60. This is illustrated by the opposing arrows on opposite sides of the stack 12 in FIG. 2. Thus secured within the stack 12, the pin region openings 26 of the lead frames 22 become isolated from the chip bonding region openings 30 by the dam bars 32 which are clamped securely along their entire length between the mated surfaces 40 and 60.

As shown in FIG. 3, the mated first surfaces 40 and second surfaces 60 establish a plurality of composite molding cavities 80 about the chip bonding region 30 of the lead frame 22 and the electronic component chip 24 bonded thereto. The mated surfaces 40 and 60 also establish an upward directed orifice 82 extending from the molding cavity 80. The gate segment 66 of the orifice region 64 narrows the orifice 82 at the point of entry to the molding cavity 80. This narrowing of the orifice 82 serves to limit both the rate at which material may enter the molding cavity 80 and the rate at which such material may leave if the stack 12 is inverted. The widened orifice 82 at the sprue segment 68 serves as a reservoir for material entering the molding cavity 80.

After the stack 12 is secured, particulate filler material 90 such as silica or alumina may then be introduced into the molding cavities 80 through their associated orifices 82. The particulate material 90 enters the molding cavity 80 slowly and gently as a falling stream due to the narrowing of the orifice 82 at the gate segment 66 thus avoiding "wire sweep." Excess particulate material 90 remaining in the orifices 82 after the molding cavities 80 have been filled may be removed therefrom by quickly turning the stack 12 over and then righting it again.

The prepared stack 12 is then heated. With lead frame, this is generally to approximately 150 degrees centigrade. Then a quantity of liquid, thermosetting epoxy resin 92 not containing a mold release compound and heated to the same temperature is introduced into the orifices 82 as shown in FIG. 4. The stack 12 is then exposed to vacuum so that all the air and, in particular, the moisture in the voids between the particulate filler material 90 in the molding cavities 80 may be removed therefrom. Since rigidly securing the stack 12 has sealed the lead frames 22 between the surfaces 40 and 60 everywhere but at the orifices 82, these gasses escape from the molding cavities 80 by bubbling up through the liquified epoxy resin 92. Once the molding cavities 80 has been evacuated, the stack 12 is returned to atmospheric pressure thereby forcing the liquid thermosetting resin 92 throughout the molding cavities 80. Because the molding cavities 80 has been previously filled with the particulate filler material 92, this introduction of the liquid thermosetting resin 92 cannot cause "wire sweep." Further, the liquid thermosetting resin 92 cannot reach the pin regions 26 because they are isolated from the chip bonding regions 30 by the dam bars 32 clamped securely along their entire length between the mated surfaces 40 and 60. The thermosetting resin 92 is then permitted to solidify within the molding cavities 80 of the rigidly secured stack 12. Thus solidified, the particulate material 90 and the thermosetting resin 92 become an encapsulation 94 about the electronic component chip 24.

An alternative procedure for introducing the thermosetting epoxy resin 92 into the molding cavities 80 is to expose the heated stack 12 to vacuum, introduce the heated thermosetting epoxy resin 92 into the orifices 82 while maintaining the stack 12 under vacuum and then returning the heated and filled stack 12 to atmospheric pressure. An advantage obtained with this alternative filling procedure is that moisture within the cavity 80 does not escape by passing through the epoxy resin 92 thus eliminating any possibility of further increasing the moisture content of the resin 92.

The stack 12 may now be disassembled to remove the encapsulated electronic component assembly 20. This disassembly is easily accomplished since the thermosetting epoxy resin 92 does not adhere to the silicone rubber from which the split matrix elements 10 are cast. However, since the resin 92 does not contain a mold release compound, the encapsulation 94 adheres strongly to the DIP lead frame 22. After removal from the stack 12, any excess resin 94 which remained in the orifice 82 during solidification is easily broken free from the encapsulation 94 at the narrow neck region formed therein by the gate segment 66, thus producing the encapsulated electronic component assembly shown in FIG. 6.

Although the present invention has been described in terms of the presently preferred embodiment, in particular encapsulating electronic components secured to DIP lead frames, it is to be understood that such disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A unitary matrix element for cast encapsulation of an item comprising:

a first surface shaped and adapted to receive and secure an item to be encapsulated, the first surface being shaped to establish a portion of a molding cavity for enclosing an item to be encapsulated and a portion of an orifice surface extending from said molding cavity surface; and a second surface located on an opposite side of the matrix element from the first surface, the second surface being shaped to mate with the first surface of another similar matrix element and to establish the remainder of said molding cavity surface and said orifice surface when two of such matrix elements are stacked together.

2. The matrix element of claim 1 further comprising registration means formed on the first surface of the matrix element for securing the item to be encapsulated thereto.

3. The matrix element of claim 1 further comprising mating registration means formed on the first and second surfaces of the matrix element for securing the elements in their mated relationship.

4. The matrix element of claim 1 wherein the element is cast from silicone rubber.

5. The matrix element of claim 4 wherein the element cast from silicon rubber has a hardness between 40 and 90 durometers.

6. The matrix element of claim 1 wherein the first surface is shaped to receive and secure a DIP lead frame having a chip bonding region and a pin region which are separated by a dam bar; and the first and second surfaces of the matrix element are adapted to contact said dam bar along the entire length thereof;

whereby mated first and second surfaces of a pair of matrix elements enclosing a received and secured DIP lead frame isolate said chip bonding region thereof from said pin region thereof.

* * * * *